US009966944B2

(12) United States Patent
Rossi et al.

(10) Patent No.: US 9,966,944 B2
(45) Date of Patent: May 8, 2018

(54) GATE DRIVER CIRCUIT FOR A HALF BRIDGE OR FULL BRIDGE OUTPUT DRIVER STAGE AND CORRESPONDING METHOD FOR DRIVING A HALF BRIDGE OR FULL BRIDGE OUTPUT DRIVER STAGE

(71) Applicant: STMicroelectronics S.R.L., Agrate Brianza (IT)

(72) Inventors: Sandro Rossi, Pavia (IT); Valeria Bottarel, Novara (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days. days.

(21) Appl. No.: 15/216,271

(22) Filed: Jul. 21, 2016

(65) Prior Publication Data
US 2017/0257092 A1 Sep. 7, 2017

(30) Foreign Application Priority Data
Mar. 7, 2016 (IT) .................................. 101623748

(51) Int. Cl.
  H03K 3/00 (2006.01)
  H03K 17/687 (2006.01)
  H03K 19/0175 (2006.01)
(52) U.S. Cl.
  CPC ... *H03K 17/687* (2013.01); *H03K 19/017509* (2013.01); *H03K 2217/0045* (2013.01)
(58) Field of Classification Search
  CPC .................................................. H03K 17/687
  See application file for complete search history.

(56) References Cited

U.S. PATENT DOCUMENTS

| | | |
|---|---|---|
| 2003/0107425 A1 | 6/2003 | Yushan |
| 2010/0123479 A1 | 5/2010 | Osaka |
| 2011/0316586 A1 | 12/2011 | Knierim |
| 2014/0203861 A1* | 7/2014 | Chen .................... H03K 17/284 327/399 |
| 2014/0300188 A1 | 10/2014 | Boezen |
| 2014/0333365 A1 | 11/2014 | Takahashi |

OTHER PUBLICATIONS

Andersen et al., "A capacitive level shifter for high voltage (2.5kV)," IEEE International Power Modulator and High Voltage Conference (IPMHVC), San Diego, CA, Jun. 3-7, 2012, pp. 450-453.

* cited by examiner

*Primary Examiner* — Daniel Puentes
(74) *Attorney, Agent, or Firm* — Seed IP Law Group LLP

(57) ABSTRACT

A gate driver circuit for a half bridge or full bridge output driver stage having a high side branch connected to one or more high side transistors and a low side branch connected to one or more low side transistors. A high side gate driver and a low side gate driver receive input signals at a low voltage level and output signals at a high voltage level as gate driving signals for the high side transistors and low side transistors. Each of the high side and the low side branches of the gate driver includes a set-reset latch having a signal output that is fed as a gate signal to the corresponding transistor of the half bridge or full bridge driver. A differential capacitive level shifter circuit receives the input signals at a low voltage level and outputs high voltage signals to drive the set and reset inputs of the set-reset latch.

21 Claims, 8 Drawing Sheets

GATE DRIVER CIRCUIT FOR A HALF BRIDGE OR FULL BRIDGE OUTPUT DRIVER STAGE AND CORRESPONDING METHOD FOR DRIVING A HALF BRIDGE OR FULL BRIDGE OUTPUT DRIVER STAGE

BACKGROUND

Technical Field

The present description relates generally to gate driver circuits for a half bridge or full bridge output driver stage.

Description of the Related Art

Recently in the market of integrated high voltage drivers the need for high frequency signals is growing. In order to reach high performance, high slew rate and low latency in the chip between the low voltage input and the high voltage output have to be addressed.

In DC-DC Converters applications high slew rate edges help to obtain higher efficiency because they lower commutation losses, hence they reduce the power consumption and increase the performance of systems that use those circuits. Moreover, a higher frequency allows smaller inductances to be chosen, this meaning higher efficiency and system lower costs.

In Envelope Tracking applications, high frequency signals allow having a proper supply voltage envelope. In these systems, the supply voltage has to be continuously adapted to the load request, in order to allow having maximum efficiency of the system. This is particularly suitable for digital communication base-stations (mobile phones and also digital television are the main examples). Moreover, as long as fast reaction to the output level has to be addressed, also a low latency from digital low voltage input signal to analog high voltage output signals across the power stage has to be obtained.

In electromedical applications and in particular in ecographic machines, high voltage half bridges are required to drive the piezoelectric element to obtain an ultrasound wave. High current peaks are required.

All these characteristics have usually to be reached through dedicated design solutions.

In FIG. 1, in order to better understand the problems of half bridges or full bridges driver output stages operating with a high slew rate signal, it is shown a half bridge driver 11 comprising a high side, i.e., the side connected to the power supply voltage, branch and a low side, i.e., the side connected to the lower reference voltage, in particular ground, branch. The half bridge 11 includes a high side output transistor, in particular a high voltage pMOS or pMOSFET Mp, and a low side output transistor, in particular a nMOS or nMOSFET Mn, which are controlled through respective gate drivers 10$p$ and 10$n$, which drive gate signals Gp and Gn applied to their respective gate electrodes. Each of the gate drivers 10$p$ and 10$n$ receives as input a respective low level signal $p_{LV}$ or $n_{LV}$, which is however referred to a high voltage ground, i.e., it is a shifted low level signal, in FIG. 1 being shown only a waveform LSC schematizing the transient oscillation causing a logic state change in the input low signal $p_{LV}$ on the high side gate driver 10$p$. Each of the gate drivers 10$p$ and 10$n$ is connected to a respective high voltage supply VPP for the high side or VNN for the low side and receives also a respective reference ground voltage referred to the respective high voltage supply voltage, VPP_RIF=VPP−VDD voltage or VNN_RIF=VNN−VDD voltage, VDD being the digital supply voltage, in particular the low level supply voltage.

With the reference 12 is indicated a parasitic inductance of a bonding wire, connecting the chip with a package pad 13, between the half bridge 11 and the high side high voltage supply VPP, and it is also indicated a voltage generator 14 associated to the package pad 13. With 15 is indicated a parasitic capacitance of the high side power MOSFET Mp, while with 16 are indicated capacitors representing capacitances existing between the supply line and the signal lines and between signal line and fixed voltages in the chip, and between the referred ground voltage VPP_RIF and fixed voltages in the chip. As already mentioned, for simplicity's sake, only parasitic elements corresponding to the high side are shown in FIG. 1, although dual parasitic elements are present in the low side.

With OLV is then indicated the overvoltage on the low voltage components relative to supply voltages VPP and reference ground voltage VPP_RIF, OV indicates a overvoltage on the signal on the gate of the high side MOSFET transistor Mp, UV a corresponding undervoltage, while OHV indicates a total overvoltage on the high voltage components at the output of the half-bridge 11. I indicates the spike of the current flowing in the high side MOSFET Mp, causing the VPP oscillations.

The parasitic elements 15 and 16 determine several effects in presence of high slew rate signals.

In the first place, high slopes on the output of a half-bridge driver cause the current spike I profile to have huge peaks. This current spikes, flowing through any metal path presenting parasitic inductance 15, such as bonding wires 12 and other bonding wires in the package, cause high oscillation on the supply voltages, which could:

damage the related power-stage MOSFET Mp or Mn with exceeding gate source voltage Vgs when the MOSFET is in the ON state, with exceeding drain source voltage Vds when the MOSFET is OFF state, damage the low voltage logic cause spurious turning-on or turning-off of the power device, because of a logic state change such as the one shown in signal LV at the gate driver 11$p$. This could cause damage of the power stage due to cross conduction (high Side and low Side simultaneously ON) and could cause the half bridge to be in a high impedance state.

Several approaches have been taken in order to avoid the above indicated negative effects.

For instance, in order to obtain a low latency it is known to use a capacitive gate driver. This solution per se however determines sensitivity to high voltage supply oscillations. To avoid this latter problem it is known to reduce the parasitic inductances in the path, from the circuit to the filtering capacitance, for example by substituting bonding wires with bump bonding, although the results are usually not sufficient.

Also filtering the supply voltage with capacitance in the package or at a very small distance from the silicon usually turns out to be not sufficient. Further passive components in the package mean increased costs.

It is also known to split the supply path to the filtering passive components and to the generator. However, the bumps number and external passive components number increase, while a low area efficiency is obtained (bump-Limited silicon area and production costs)

Of course, also a slow turn-on and turn-off can be attempted with a lower working frequency and slew rate, but this determines limited functionalities, i.e., high propagation delay in the chip.

With regard to the problem of the spurious turn-on and turn-off, it is known to use a resistive level shifter which however is not always effective and causes high power consumption and slow commutations. A mask circuit instead is not applicable when several half bridges share the same power supply.

BRIEF SUMMARY

Various embodiments of the present disclosure may apply, e.g., to envelop tracking for 4G, 5G, mobile base stations, digital stations, digital television, DC-DC converters, ultrasound pulsers.

One or more embodiments provide a gate driver circuit for a half bridge or full bridge output driver stage, operating with high slew rate, which solves the drawbacks of the prior art.

The claims form an integral part of the technical teaching provided herein in relation to the various embodiments.

According to the solutions described herein, a circuit includes high side and the low side branches each including a set-reset latch with a signal output fed as a gate signal to the corresponding transistor of the half bridge or full bridge driver, a differential capacitive level shifter circuit receiving said input signals at a low voltage level and outputting high voltage signals to drive the set and reset inputs of the set-reset latch.

In variant embodiments, the circuit includes that said differential capacitive level shifter circuit includes a capacitive level shifter circuit portion receiving said input signals at a low voltage level and shifting said input signals at a low voltage level to a high voltage level and supplying them to a differential circuit with outputs feeding respectively the set and reset inputs of the set-reset latch.

In variant embodiments, the circuit includes that the set-reset latch feeds its output to the transistor through a drive chain comprising a plurality of inverting buffers defining taps, the differential circuit includes two feedback circuit modules configured to, when enabled, feed an additional current to the two outputs of the differential circuit, said circuit modules being enabled by respective feedback signals obtained from taps of said delay line, in particular the first feedback signal corresponding to a tap supplying the inverted output of the set-reset latch and the second feedback signal being obtained at the following tap.

In variant embodiments, the circuit includes a low level signal generator receiving as input a PWM signal and outputting said low level signals, configured to generate a delayed input signal delaying the input PWM signal of a given time delay, obtaining a low side signal to drive the low side transistor performing an OR Boolean operation on the delayed input signal and input PWM signal, and an obtaining a high side signal to drive the high side transistors, performing a AND Boolean operation on the delayed input signal and input PWM signal.

In variant embodiments, the circuit includes the generator that is further configured to obtain from the low side signal a low side low level on signal having an on trigger pulse of given length starting in correspondence of the rising edge of the low side signal and a low side low level off signal having an off trigger pulse of given length starting with the falling edge of the low side signal and a high side low level on signal and a high side low level off signal having trigger pulses and starting in correspondence of the rising edge and of the falling edge of the high side signal.

In variant embodiments, the circuit includes an additional synchronicity loop, which produces a synchronism PWM delayed signal which is synchronized and delayed with respect to the PWM signal, said additional synchronicity loop having as inputs from taps of the high side and low side delay lines a low side delayed signal and a high side delayed signal, said additional synchronicity loop being configured to obtain from said input signals set and reset signals of a second set-reset latch which outputs the synchronism PWM delayed signal.

In various embodiments, the solution described herein is also directed to a method for driving a half bridge or full bridge output driver stage using the gate driver circuit and performing the operations of the gate driver circuit in one of the above embodiments.

BRIEF DESCRIPTION OF THE SEVERAL VIEWS OF THE DRAWINGS

The solution will now be described purely by way of a non-limiting example with reference to the annexed drawings, in which.

DETAILED DESCRIPTION

The ensuing description illustrates various specific details aimed at an in-depth understanding of the described embodiments. The embodiments may be implemented without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is meant to indicate that a particular configuration, structure, or characteristic described in relation to the embodiment is comprised in at least one embodiment. Likewise, phrases such as "in an embodiment" or "in one embodiment", that may be present in various points of the present description, do not necessarily refer to the one and the same embodiment. Furthermore, particular conformations, structures, or characteristics can be combined appropriately in one or more embodiments.

The references used herein are intended merely for convenience and hence do not define the sphere of protection or the scope of the embodiments.

Figure 1:
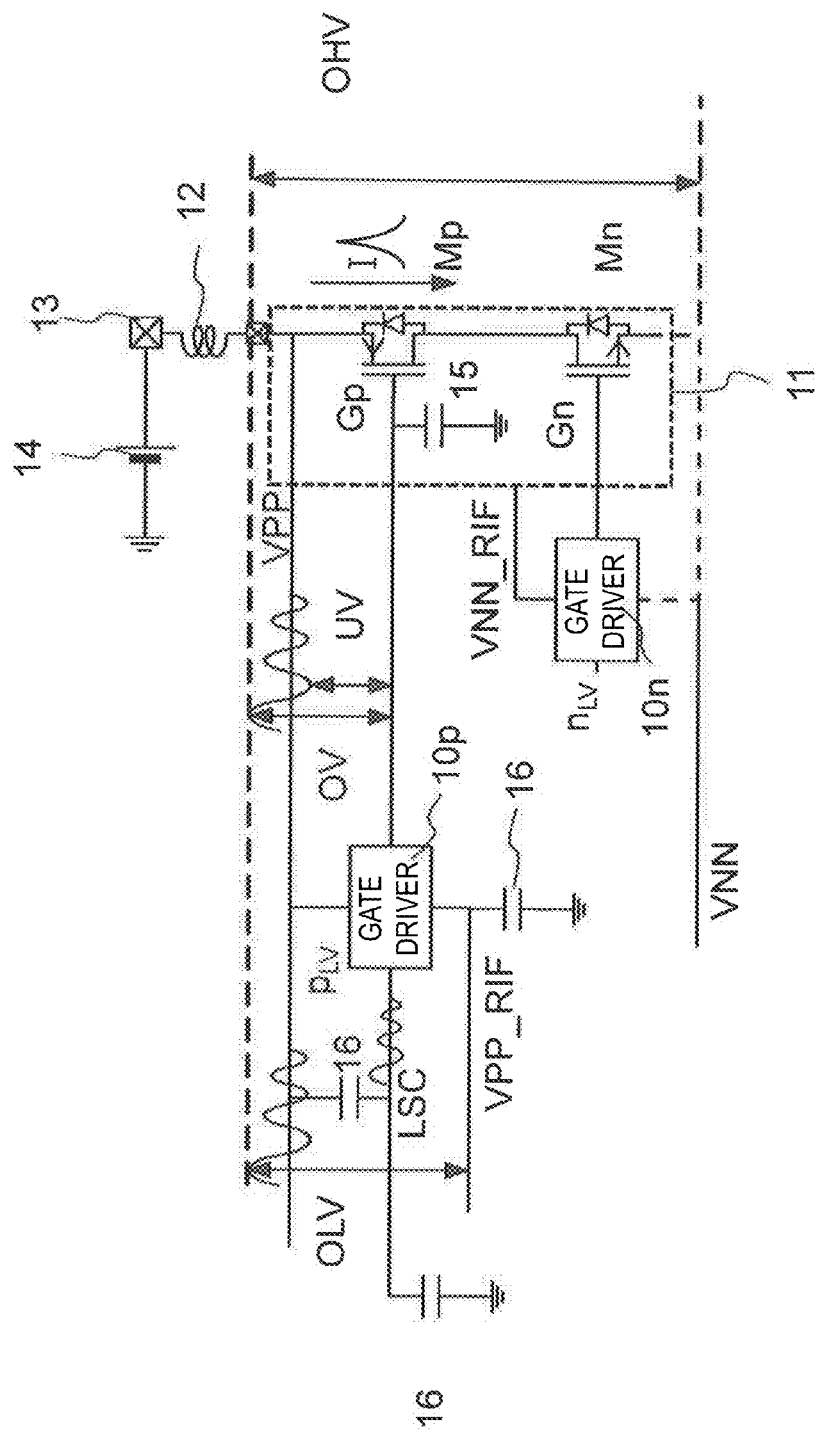
FIG. 1 is a circuit diagram of a conventional half bridge driver.
Figure 2:
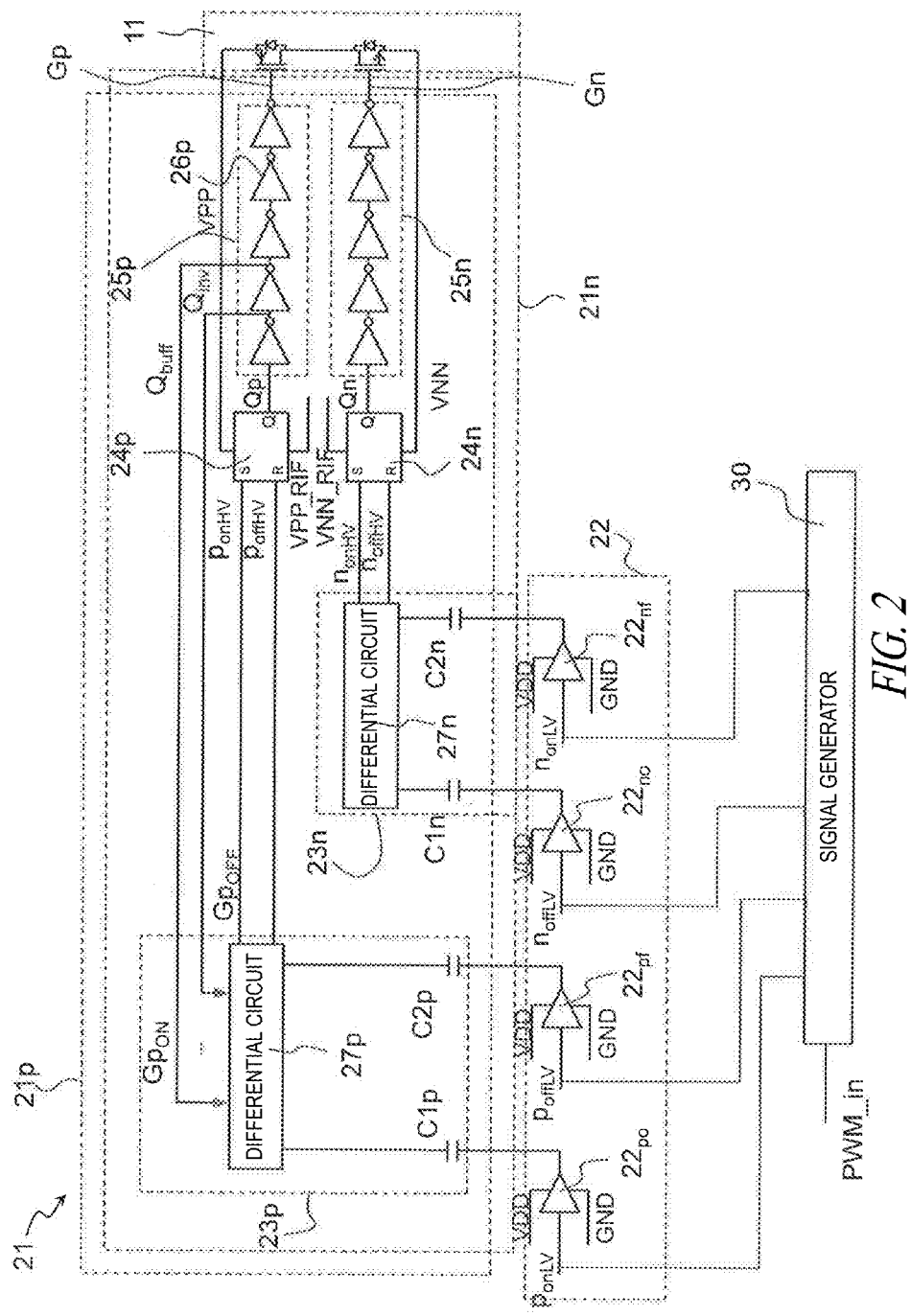
FIG. 2 is a circuit diagram schematically representing one embodiment of a gate driver circuit as herein described.

In FIG. 2 it is shown a half bridge output driver stage 11 which is driven by a structure of gate driver 21 comprising a high side gate driver 21$p$ and a low side gate driver 21$n$.

The structure of gate driver 21 receives two low level signals, a high side low level on signal $p_{ONLV}$ and a high side low level off signal $p_{OFFLV}$ at respective low voltage drivers 22$po$ and 22$pf$, which are connected to the digital voltage supply VDD and the corresponding ground GND. Low voltage high side drivers 22$po$ and 22$pf$ along with corresponding low voltage low side voltage drivers 22$no$ and 22$nf$ are comprised in low level driving stage 22.

Figures 7A, 7B:
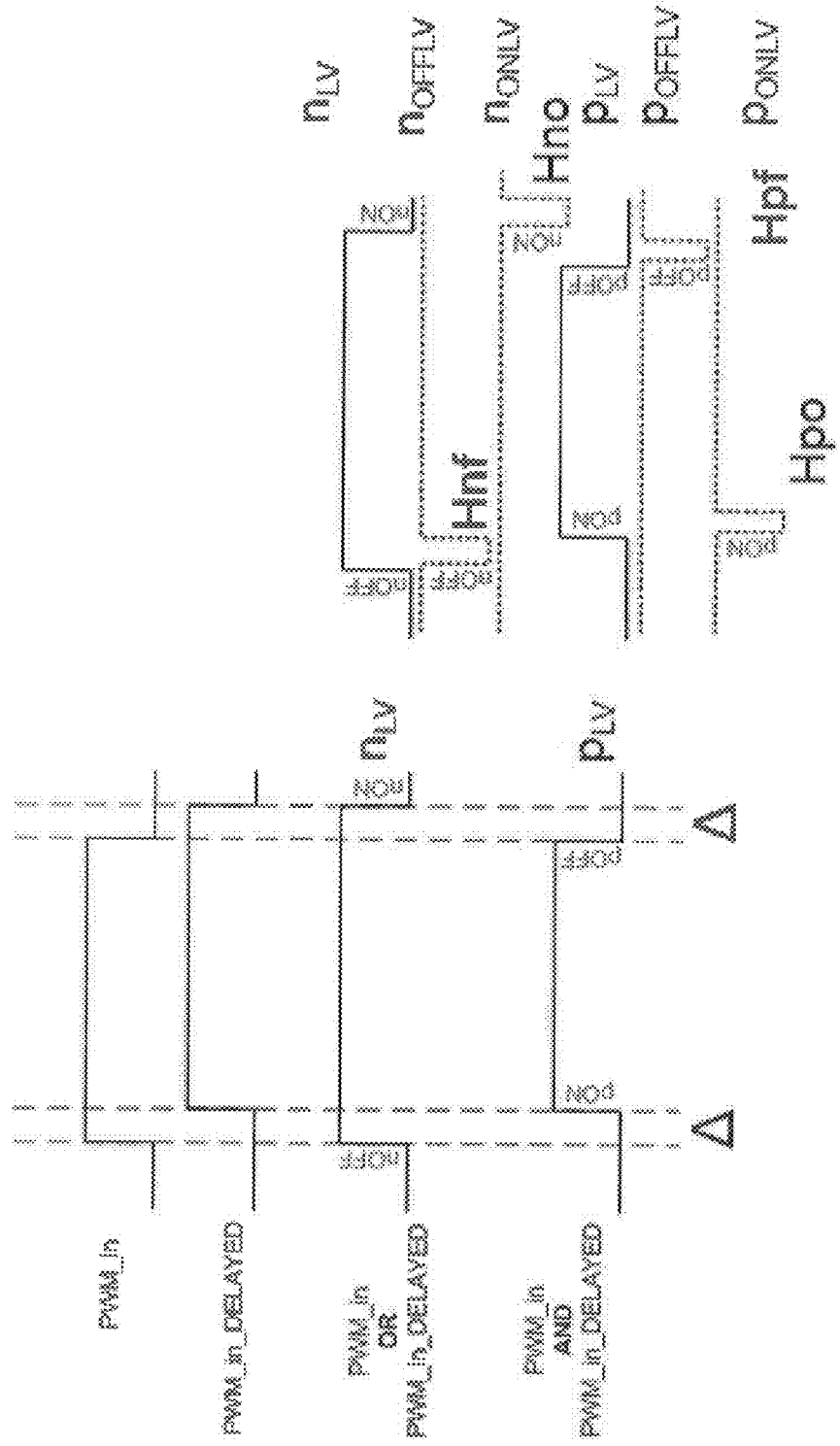
FIGS. 7A and 7B are timing diagrams representing further signals employed in the gate driver circuits according to embodiments of the present disclosure.

Such signals are preferably generated by a signal generator 30, which receives an input PWM signal PWM_in, shown in the timing diagram of FIG. 7A, and generates the high side low level on signal $p_{ONLV}$ and the high side low level signal $p_{OFFLV}$. The signal generator 30 in general controls all the high side and low side signals. In FIG. 7A timing diagrams of other signals generated by the signal generator 30 are shown. In particular the signal generator 30 generates a delayed input signal PWM_in_delayed, delaying the input PWM signal PWM_in, for instance by means of a delay line, of a given time delay Δ. Then the signal generator circuit 30 performs an OR on the delayed input signal PWM_in_delayed and input PWM signal PWM_in, obtaining a low side signal $n_{LV}$ to drive the low side MOSFET and an OR on the delayed input signal PWM_in_delayed and input PWM signal PWM_in, obtaining a high side signal $n_{LV}$ to drive the high side MOSFET, the latter having the rising edge delayed of time delay Δ and the falling edge anticipated of the time delay Δ in order to avoid having both the MOSFET of the half bridge 11 conducting at the same time. In FIG. 7A with nOFF is indicated the transition corresponding to the nMOS Mn going in the off state, while nON indicates the on state. In the same way pOFF is indicated the transition corresponding to the power pMOS Mp going in the off state, while pON indicates the on state.

From the low side signal $n_{LV}$, as shown in FIG. 7B, the generator 30 can obtain a low side low level off signal $n_{OFFLV}$ having a trigger pulse Hnf, of given length from high state to low state starting in correspondence of the off state nOFF of the nMOS Mn, at the rising edge of the low side signal $n_{LV}$, and a low side low level on signal $n_{ONLV}$ having a trigger pulse Hno of given length starting with the falling edge (state nON) of the $n_{LV}$ low side signal. The same can be done with respect to the high side signal $p_{LV}$ obtaining a high side low level on signal $p_{ONLV}$ and a high side low level off signal $p_{OFFLV}$ having trigger pulses Hpo and Hpf from the high to the low logic state starting in correspondence of the rising edge and of the falling edge of the high side signal $p_{LV}$.

According to an aspect of the solution here described, the low side low level signals $p_{OFFLV}$, $p_{ONLV}$ at the output of each such low level high side drivers 22$po$ and 22$pf$ are to be fed as set and reset signal to the set S and reset R inputs of a high side set-reset latch 24$p$ respectively, while the high side low level signals $n_{OFFLV}$, $n_{ONLV}$ at the output of each such low level low side drivers 22$no$ and 22$nf$ are to be fed to the set S and reset R inputs of a low side set-reset latch 24$n$. The high side output Qp of the high side latch 24$p$ drives the high side pMOS transistor Mp and the low side output Qn of the low side latch 24$n$ drives the highs side nMOS transistor Mn.

However according to a further relevant aspect of the solution here described, in order to avoid spurious SET/RESET due to supply voltage oscillations, a high side differential capacitive level shifter circuit 23$p$ is interposed between the high side low level signals $p_{OFFLV}$, $p_{ONLV}$ and the high side set-reset latch 24$p$ and a high side differential capacitive level shifter circuit 23$n$ is interposed between the low side low level signals $n_{OFFLV}$, $n_{ONLV}$ and the low side set-reset latch 24$n$.

Now, the high side differential capacitive level shifter circuit 23$p$ only will be described, since the low side differential capacitive level shifter circuit 23$n$ has the same structure, taken in account that is on the low side of the half bridge and pertains to a nMOS instead of a pMOS transistor.

Thus, in particular, the output of the two high side low level drivers 22$po$ and 22$pn$ is connected to one end of respective high voltage capacitors C1$p$ and C2$p$, included the high side differential capacitive level shifter circuit 23$p$. The other end of the high voltage capacitors C1$p$ and C2$p$ is the input of a differential circuit 27$p$. Such differential circuit 27$p$ outputs a high voltage on signal $p_{ONHV}$ and a high voltage off signal $p_{OFFHV}$, which, as mentioned, are brought respectively to the set and reset inputs of the set-reset latch 24$p$. The output Qp of the set-reset latch 24$p$ is supplied to a drive chain 25$p$, comprising a plurality of inverting buffers 26$p$ with increasing current capacity. In particular are shown five inverters 26$p$, at each output of which a tap is defined at which a version the output Qp of the latch, alternatively inverted, i.e., negated, or not with respect to the output Qp of the latch can be drawn. At the end of the drive chain 25$p$ the gate signal Gp is obtained which is applied to the gate of the high side MOSFET Mp. At the output of the first inverter 26$p$ of the drive chain 25$p$ an inverted signal $Q_{inv}$ is taken, which is fed back as on feedback signal $Gp_{ON}$ to a feedback input of the differential circuit 27$p$. At the output of the second inverter 26 of the drive chain 25$p$ a buffered signal $Q_{buff}$ is drawn, which is fed back as off feedback signal $Gp_{OFF}$ to another feedback input of the differential circuit 27$p$.

With reference to FIG. 2 it has to be underlined that, although not shown in the drawing, from the low side drive chain 25$n$ a on feedback signal $Gn_{ON}$ to a feedback input of the low side differential circuit 27$n$ and an off feedback signal $Gp_{OFF}$ to another feedback input of the differential circuit 27$n$ are fed back, these feedback signals generated in the same manner described for the high side.

Figure 3A:
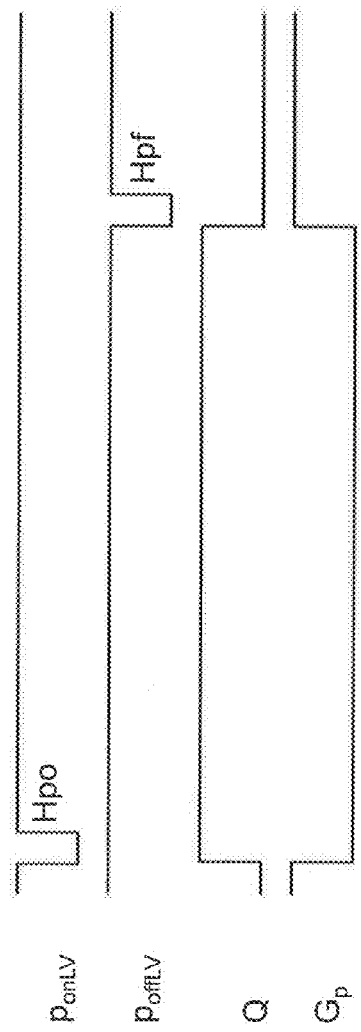
FIGS. 3A and 3B are timing diagrams representing signals employed in the gate driver circuit of FIG. 2.

In FIG. 3A it is shown a time diagram indicating the main signals of the circuit shown in FIG. 2. Such signals are of the type already discussed with reference to FIGS. 7A and 7B, i.e., the low level signals inputting the differential circuit have pulses Hpo, Hpf.

As shown, when the high side low level on signal $p_{ONLV}$ goes from high to low logic level for the duration of a trigger pulse Hpn, the output Qp of the high side set-reset latch 24$p$ goes to high logic level, and the high gate signal Gp goes to low logic level. When the low side low level on signal $p_{OFFLV}$ goes from high to low logic level for the duration of a pulse Hpo, the output Qp of the set-reset latch 24$p$ goes to low level, and the high side gate signal Gp goes high.

Figure 3B:
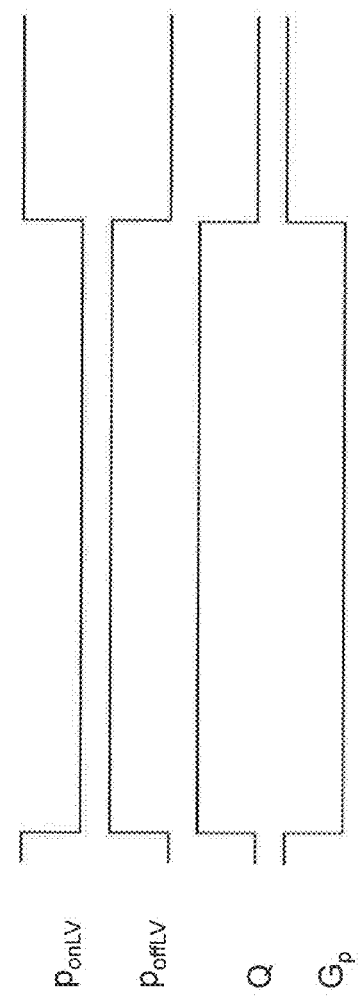

In FIG. 3B, on the other hand, it is shown a high side low level off signal $P_{OFFLV}$ and a high side low level on signal $P_{ONLV}$ which can be used as input of the gate driver 21, which are simply a copy of the PWM input signal PWM_in and of its negated signal, specifically of the OR-ed and AND-ed signal shown in FIG. 7A. The gate driver 21 however is able in the same way to switch the output Qp of high the set-reset latch 24$p$ on the falling edge of the high side low level on signal $P_{ONLV}$, such output Qp of the set-reset latch going to high level, while the high gate signal Gp goes low. This means that through the gate driver 21 is obtained that the half bridge switches when the input signals go to the low level, while it is insensitive to the high level of a triggering pulse Hpo, Hno like in FIG. 3A.

Figure 4:
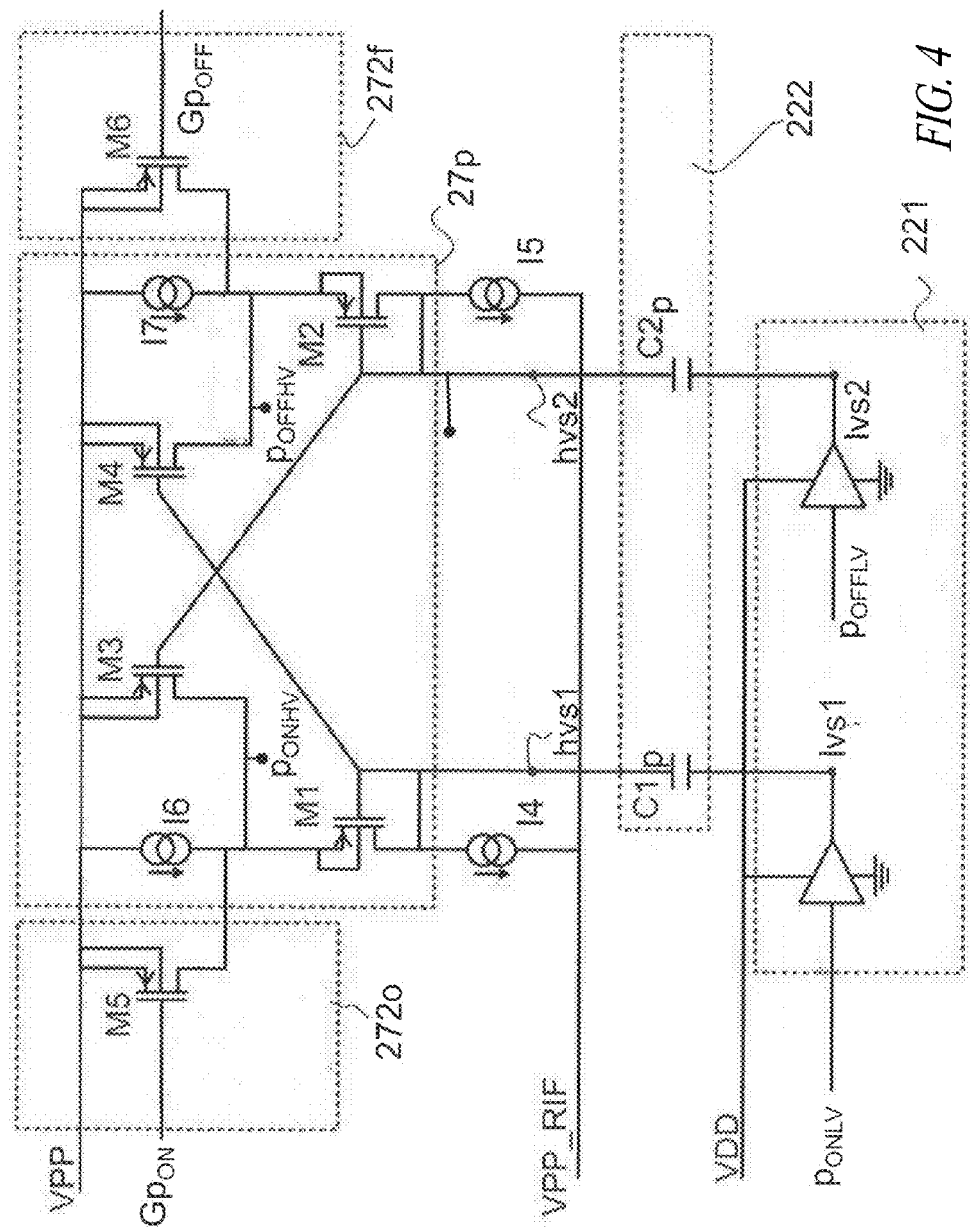
FIG. 4 is a circuit diagram detailing one embodiment of the high side differential capacitive level shifter of the gate driver circuit of FIG. 2.

In FIG. 4 it is detailed one of the differential circuits, the high side differential capacitive level shifter 23$p$.

Circuit 23p includes a differential circuit 27, in particular a differential amplifier, comprising four low voltage MOSFET, M1, M2, M3, M4. Two hysteresis circuit modules 272o and 272f receive respectively the on feedback signal $GP_{ON}$ and the off feedback signal $GP_{OFF}$, their outputs being connected to the outputs of the differential circuit 27p, where high voltage on signal $p_{ONHV}$ and high voltage off signal $p_{OFFHV}$, which are the outputs of a differential circuit having the low voltage on signal $p_{ONLV}$ and low voltage off signal $p_{OFFLV}$ as input. In other words, the differential circuit 27p has a differential input, represented by the low voltage on signal $p_{ONLV}$ and low voltage off signal $p_{OFFLV}$. The differential circuit 27p enables the high voltage on signal $p_{ONHV}$ and high voltage off signal $p_{OFFHV}$.

In FIG. 4 are also shown the low voltage drivers 22, which are supplied with low voltage VDD supply, referred to the digital ground GND. Digital low level input signals are $p_{ONLV}$ and $p_{OFFLV}$. The output of each driver, as already indicated with reference to FIG. 2, is a low level signal lvs1, lvs2 on an end or terminal of the high voltage capacitance C1p or C2p, on the low voltage side of a level shifter 222p represented by the two capacitors. The high voltage capacitance C1p or C2p connect the low voltage portion, i.e., drivers 22, of the circuitry with the high voltage portion represented by the differential amplifier 27p and the hysteresis circuit modules 272.

The differential amplifier 27p is supplied with the high voltage supply VPP and the ground voltage VPP_RIF referred to the high voltage supply VPP (VPP_RIF=VPP−VDD). The input signals, hvs1 and hvs2 for the differential circuit are taken from the high voltage terminal of the high voltage capacitances C1p or C2p of the level shifter 222.

The input high voltage signal hvs1 is connected to the gate and drain terminals of a pMOS M1, which is in trans diode configuration, and to the gate of a pMOS M4, which is source connected to the high voltage supply VPP. The other input high voltage signal hvs2 is connected to the gate and drain terminals of the pMOS M2, in trans diode configuration and to the gate of the pMOS M3, source connected to the high voltage supply VPP. The drain of the pMOS M3 is connected to the source of the pMOS M1, while drain of pMOS M4 is connected to the source of pMOS M1. Drain of pMOS M1 is connected to ground voltage VPP_RIF through a polarization current generator I4, while drain of pMOS M2 is connected to ground voltage VPP_RIF through a polarization current generator I5. A polarization current generator I6, connected to the high voltage supply VPP, forces a current in the drain of pMOS M3, while in the same way a polarization current generator I7, connected to the high voltage supply VPP, forces a current in the drain of pMOS M4. Such drain of pMOS M3 and M4 are the output of the differential circuit 231, on which high voltage signals $p_{ONHV}$ and $p_{OFFHV}$ are formed.

The differential circuit 27 basically operates as follows. In static condition the low level signals lvs1 and lvs2 are at supply voltage VDD, the high level signals hvs1 and hvs2 are at the high voltage supply VPP for the high side. The capacitance C1p, C2p is charged and a voltage drop of (VPP−VDD) is present between its terminals (so that the capacitance might be a high voltage component if voltage VPP is a high voltage power supply).

The active signal that can be transmitted through the high voltage capacitance C1p and C2p is a negative edge. A negative edge of amplitude of the digital supply voltage VDD (signal from VDD to GND) on the low level signal lvs terminal of the capacitance causes a negative edge on the high level signal hvs terminal. It is to be noted that in practice, due the to the parasitic capacitances which operate a charge sharing with high voltage capacitances C1p or C2p, the charge on the high voltage capacitances is slightly reduced during the signal edge with respect to the nominal value VPP−VDD. Therefore the amplitude of the edge at the terminals of high level signals hvs1 e hvs2 is slightly lower than VDD.

If a negative edge occurs, for example at the terminal on which the low level signal lvs1 is (and at the input hvs1 of the differential circuit), this negative level on signal hvs1, equal to the level on the gate of MOSFET M1, causes the source of MOSFET M1, which corresponds to the output on which is formed the high voltage on signal $p_{ONHV}$ of the differential circuit, to follow and have a negative edge.

At the same time, the high level signal hvs1 is also the gate of MOSFET M4, so that a negative edge on the high level signal hvs1 causes also the drain of MOSFET M4, which corresponds to the output on which is formed the high voltage off signal $p_{OFFHV}$ of the differential circuit, to have a rising edge.

If a common mode input (i.e., negative edges at both the inputs) occurs at the gate of MOSFETs M1 and M2, each effect on the output of the differential circuit, i.e., the drains of MOSFETs M1 and M2, that would both have negative edges accordingly to the output, is cancelled by the effect of the same common mode input on MOSFETS M3 and M4, that, in correspondence of the same negative edges on their gate, are causing positive edges on their drain. A common mode input as here described is usually the result of a disturbance.

Hysteresis circuit modules 272 add a hysteresis to the differential circuit 27p and to the whole circuit 23p. Each hysteresis circuit module 272 includes a respective pMOS, M5, M6, source connected to the high voltage supply VPP and drain connected with such drain of pMOS M3 and M4 which are the outputs of the differential circuit 231. Their gates are respectively controlled by the on feedback signal $Gp_{ON}$ and the off feedback signal $Gp_{OFF}$, so that such pMOS M5 and M6 add an extra-current to the polarization current coming from current generators I6 and I7. In other words, the inputs of the hysteresis circuits 272 are the on feedback signal $Gp_{ON}$ and the off feedback signal $Gp_{OFF}$ representative of the state of the high side gate signal Gp.

Thus, if the power pMOS Mp of the half bridge 11 is in OFF state:
Gp=VPP
$GP_{OFF}$=VPP
$GP_{ON}$=VPP_RIF The extra current of pMOS M5 is flowing to the output node on which is formed the high voltage on signal $p_{ONHV}$, so that a current greater than the sum of the current in pMOS M5 and current generator I6 have to be sinked from the $p_{ON\_HV}$ signal node in order to have a voltage drop on it, and cause a Set S event in the set-reset latch 24p, thus causing a logic state change.

If the power pMOS Mp of the half bridge 11 is ON:
Gp=VPP_RIF
$Gp_{OFF}$=VPP_RIF
$Gp_{ON}$=VPP The extra current of pMOS M6 is flowing to the output node on which is formed the high voltage off signal $p_{OFFHV}$, so that a current greater than the sum of the current in pMOS M6 and polarization current generator I7 has to be sinked from node of signal $P_{OFFHV}$ in order to have a voltage drop on it, and cause a reset R event in the set-reset latch 24p, thus causing a logic state change.

The added current therefore makes it difficult to turn off the power pMOS when it is ON, (and vice versa), so that only a driving signal coming from the drivers 22 through the capacitive level shifter 222 is strong enough to cause a logic state change, while a differential interference from the high voltage supplies oscillation is not strong enough.

The hysteresis function implemented by the circuits 272o, 272f adds, in other words, a sort of inertia to the state change of the power MOSFET Mp and Mn, so that the state is changed only when commanded by a signal coming from the control logic, and not by disturbances. While the differential circuits prevents the action of common mode disturbances, the hysteresis circuits strengthen the gate driver with respects to possible asymmetries between the high and low branch of the circuit, due for instance to the technological aspects of the production process, favoring a transition between the logical levels with respect to the other.

Only if the power pMOS output transistor Mp on the high side is on, the MOSFET M6 of the hysteresis circuit 272f is on. When a negative edge occurs on the other input high voltage signal hvs2, which should make the high side power pMOS to go off, with the lowering of the voltage on the gate of MOSFET M2, also the voltage source of MOSFET M2 attempts to decrease, however the hysteresis circuit 272f operates against such decrease through the increase of the current in MOSFET M6, which is caused by the increase of its drain-source voltage VDS. It is noted that since it is driven the drain of MOSFET M6, not the gate, it is accepted a second order effect on the current value.

To obtain the hysteresis function it is more in general needed that the differential circuit 23p, 23n includes two feedback hysteresis circuit modules, 272o, 272f, configured to, when enabled, feed an additional current to the two outputs of the differential circuit 23p, 23n, said circuit modules being enabled by respective feedback signals which logic state correspond to the logic state at the input of the output transistor of the driver stage 11 of the corresponding branch and its negated. With reference to FIG. 2, where only feedback signals $Gp_{ON}$ and $Gp_{OFF}$ are shown for simplicity, the feedback hysteresis circuit modules 272o and 272f receive as input the signal at the gate of the high side output MOS Mp (high or low logic level of its gate) and its negated.

This can be obtained for instance, alternatively:
- using as feedback signal, i.e., $Gp_{ON}$ and $Gp_{OFF}$, the sole gate signal and performing the negation operation locally, in the hysteresis circuit 272;
- using set-reset latches as latch 24 having both the Q output and the negated output Qn as feedback signals i.e., $Gp_{ON}$ and $Gp_{OFF}$ brought as input to the hysteresis circuit;
- exploiting the drive chain 25p, 25n, which includes a chain of inverting buffer 26 having size, i.e., current available at their output, but also input capacitance, which increase along the chain, and taking two consecutive output signals of two consecutive inverting buffers 26, which are one the negated of the other. This is the solution shown in FIG. 2.

Figure 5:
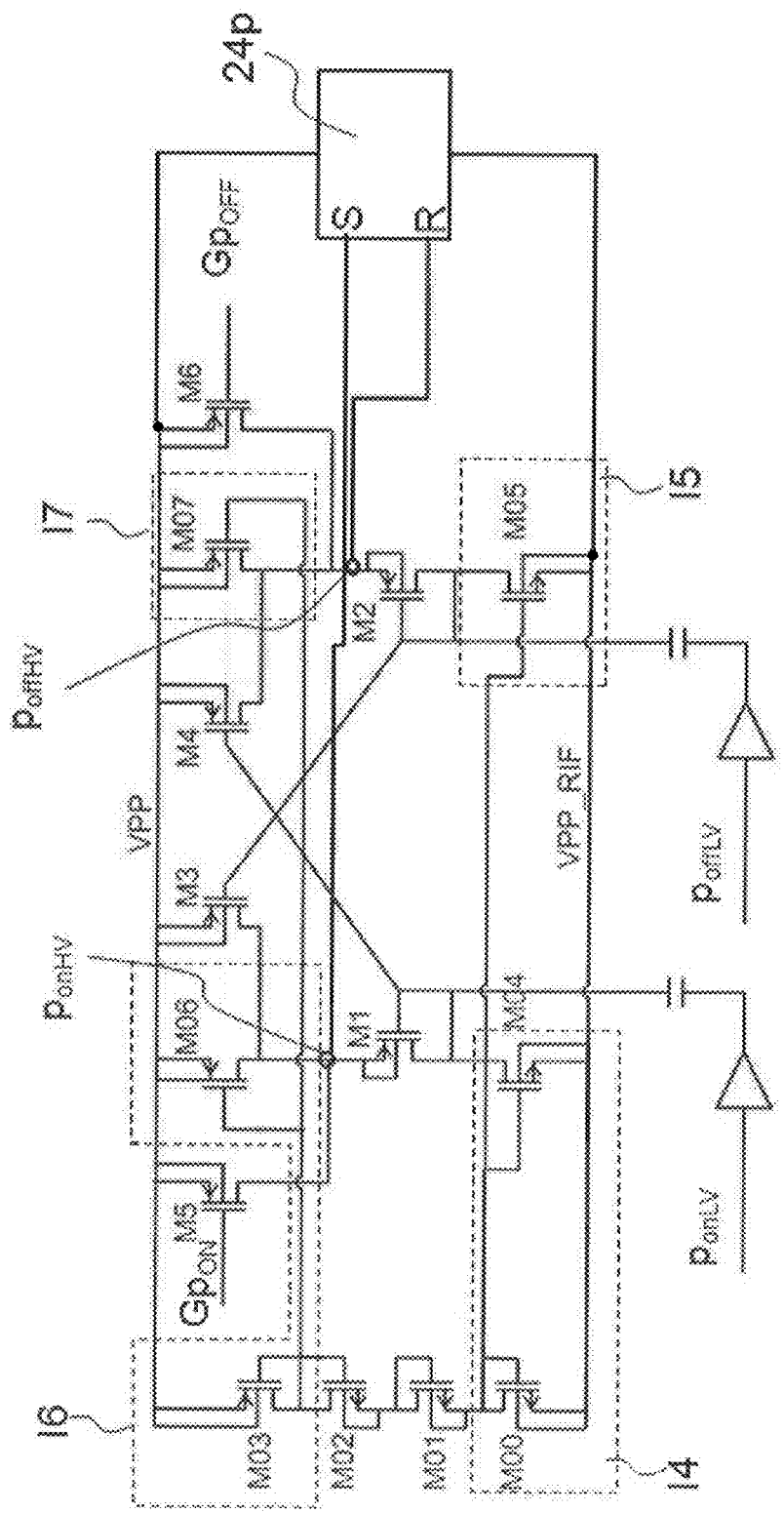
FIG. 5 is a circuit diagram representing one embodiment of the circuit of FIG. 4.

In FIG. 5 it is shown an implementation of the circuit of FIG. 4, in particular an implementation of the current generator I4, I5, I6, I7. As shown, generator I4 is obtained by a current mirror formed by a nMOS MOSFET M00 and MOSFET M04, while a nMOS MOSFET M05 forms with nMOS MOSFET M00 a second current mirror in parallel, which corresponds to current generator I5. As shown, such nMOS M00, M04 and M05 have their source connected to the high reference ground VPP_RIF, while the drain of M04 is connected to the drain of pMOS M1 and the drain of M05 is connected to the drain of M2.

In the same way, generator I6 is obtained by a current mirror formed by a pMOS MOSFET M03 and pMOS MOSFET M06, while a pMOS MOSFET M07 forms with pMOS MOSFET M03 a second current mirror in parallel, which corresponds to current generator I7. As shown, such nMOS M03, M06 and M07 have their source connected to the high voltage supply VPP, while the drain of M06 is connected to the source of pMOS M1 and the drain of M07 is connected to the source of M2. A first polarization nMOS M01 is placed with the drain connected to the drain of M00 and the gate and it is in trans diode configuration, with the gate short-circuited to the drain. A second polarization nMOS M02 in trans diode configuration is connected with the drain to the source of M01 and with the source to the drain of M03. This first and second polarization nMOS M01 and M02 are sized to set the working point of the current generators.

Figure 6:
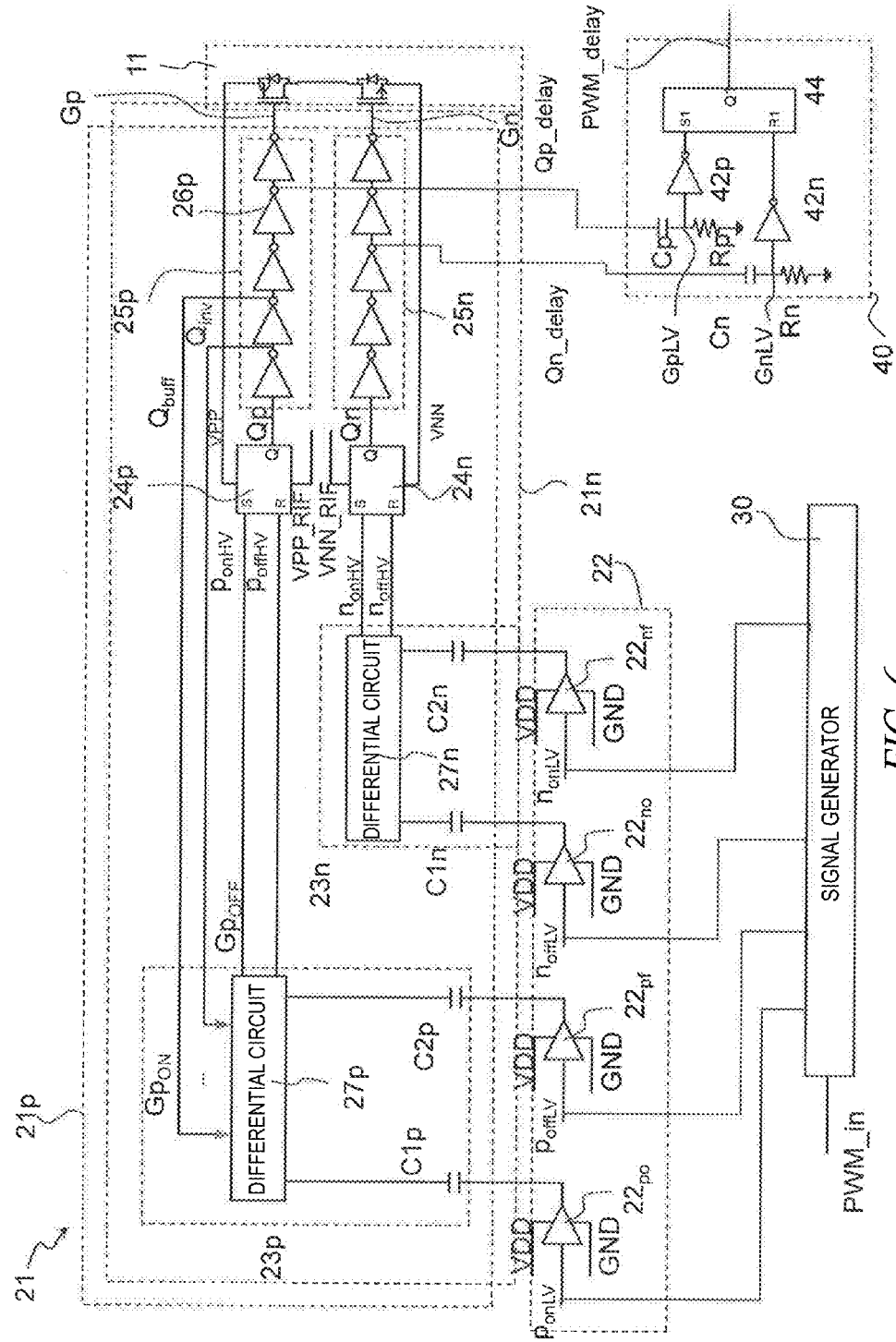
FIG. 6 represents an alternative embodiment of a gate driver circuit herein described.

In FIG. 6 it is shown a gate driver 21 associated to an additional synchronicity loop 40, which produces a synchronism PWM delayed signal PWM_delay. In FIG. 6 it is also shown the low level generator 30 already mentioned before with reference to the low level signals of FIG. 2. As discussed, a PWM signal PWM_in enters the generator 30, while the additional synchronicity loop 40 derives from the drive chains 25p and 25n, a low side delayed signal Qn_delay, after the third low side inverter 26n, and a high side delayed signal Qp_delay, after the fourth high side inverter 26p, which are the inputs of the loop 40.

The synchronicity loop 40 includes a low voltage capacitor Cp an Cn on each of the high and low side inputs, connected at the input of a driver 42p or 42n. The input is connected to the low voltage ground by a resistor Rp (Rn), so that low voltage capacitor Cp (Cn) brings a low level voltage delayed signal GpLV (GnLV) on the input of the driver 42p(42n). The output of the high side driver 42p is, after performing an OR with the PWM input signal PWM_in in a logic OR gate 43p, fed to a set input of a set-reset latch 44. In a dual manner, the output of the low side driver 42n is, after performing an OR with the negated PWM input signal PWM_n signal in a logic OR gate 43p, a fed to a reset input of a set-reset latch 44, which outputs then the synchronism PWM delayed signal PWM_delay.

Figure 8A:
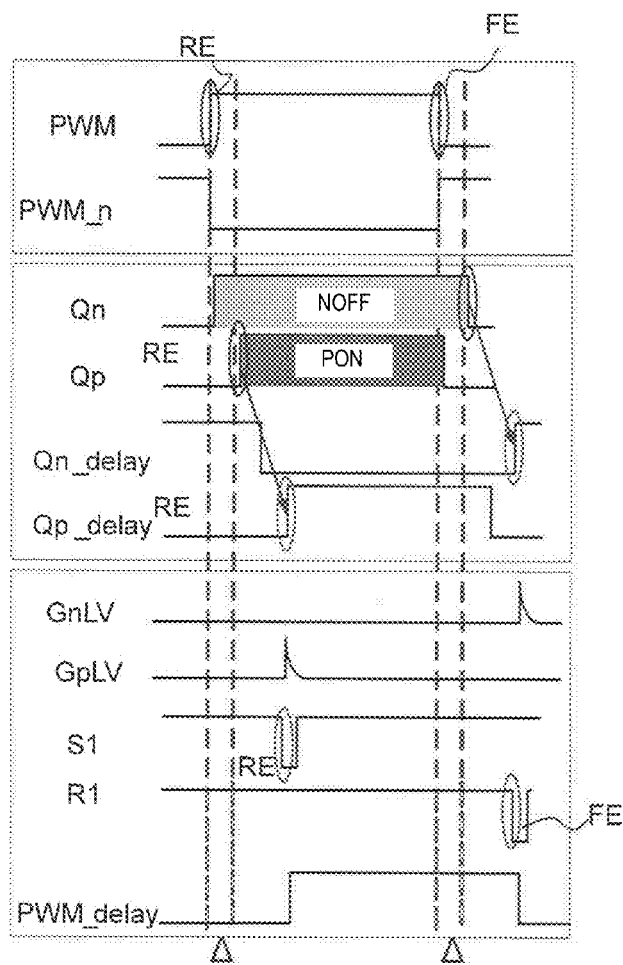
FIGS. 8A and 8B are timing diagrams representing signals employed in the embodiment of FIG. 6.
Figure 8B:
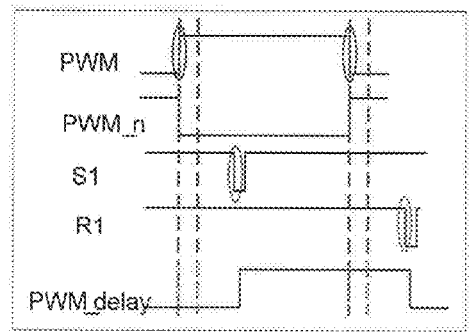

The corresponding signals are shown in the timing diagram of FIGS. 8A and 8B.

In FIG. 8A within ellipses RE are indicated the rising edges of the input signal PWM_in. Such rising edge RE propagates through the various signals of gate driver 21 and synchronization loop 40 to produce the delayed rising edge of the PWM delayed signal PWM_delay. Ellipses FE indicate in the same way the falling edges, in particular of the input signal PWM_in and of the PWM delayed signal PWM_delay. In FIG. 8A it is depicted the case corresponding to FIG. 3B in which the circuit 21 switches on the rising edges of the PWM signal, but no pulses Hpo, Hpf, are generated for the low level driving signals.

The gate driver circuit just described obtains several advantages.

The gate driver circuit described performs level shifting from a low voltage digital input to the gates of the half-bridge with a fast level shifting, low power consumption by a capacitive level shifter The gate driver circuit described in particular takes advantage of a differential topology to avoid logic state changes due to common mode supply voltage oscillations. The use of hysteresis increases margins in case of mismatch between the two branches of capacitive level shifter.

Of course, without prejudice to the principle of the embodiments, the details of construction and the embodiments may vary widely with respect to what has been described and illustrated herein purely by way of example, without thereby departing from the scope of the present embodiments, as defined the ensuing claims.

It should be noted that the bridge MOSFETs are preferably high voltage MOSFETs, however the gate driver circuit here described can be used with low voltage bridge MOSFETs, the high voltage being applied to their gate, while the power supply of the bridge is low, for example, the digital voltage supply.

Of course, the high voltage supply VPP for the high side and/or VNN for the low side can also be negative, and to the person skilled in the art it is apparent the dual structure of the gate driver that should be used in that case, which falls within the scope of protection of the gate drivers here described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate driver circuit for a half bridge or full bridge output driver stage, comprising:
   a high side gate driver and a low side gate driver receiving input signals at a low voltage level and configured to output signals at a high voltage level as gate driving signals for one or more high side output transistors of a high side branch and one or more low side output transistors of a low side branch, each of the high side and the low side branches of the gate driver including:
   a set-reset latch having a set input and a reset input, the set-reset latch that in operation generates an output signal with the gate drive signal of the corresponding output transistor of the half bridge or full bridge driver stage being based on the output signal; and
   a differential capacitive level shifter circuit that in operation receives the input signals at a low voltage level and outputs on two outputs high voltage signals to drive the set and reset inputs of the set-reset latch.

2. The circuit according to claim 1 wherein said differential capacitive level shifter circuit includes a capacitive level shifter circuit portion receiving said input signals at a low voltage level and shifting said input signals at a low voltage level to a high voltage level and supplying them to a differential circuit which outputs feeds respectively the set and reset inputs of the set-reset latch.

3. The circuit according to claim 2 wherein said differential capacitive level shifter circuit includes two hysteresis circuit modules configured to, when enabled, feed an additional current to the two outputs of the differential capacitive level shifter circuit, said hysteresis circuit modules being enabled by respective feedback signals corresponding to the logic state at the input of the one or more output transistors of the driver stage of the corresponding branch and its complement.

4. The circuit according to claim 3 wherein the set-reset latch feeds its output to the output transistor of the driver stage through a drive chain comprising a plurality of inverting buffers defining taps; and
   wherein said two hysteresis circuit modules are configured to, when enabled, feed an additional current to the two outputs of the differential capacitive level shifter circuit and are configured to be enabled by respective feedback signals obtained from taps of said drive chain, in particular a first feedback signal corresponding to a first tap supplying the inverted output of the set-reset latch and a second feedback signal obtained at the following tap.

5. The circuit according to claim 4 further comprising a low level signal generator receiving as an input a PWM signal and outputting said signals at a low voltage level and configured to generate a delayed input signal delaying the input PWM signal by a given time delay, and providing a low voltage level signal to drive the one or more low side transistors and performing an OR Boolean operation on the delayed input signal and input PWM signal, and providing a high side signal to drive the one or more high side transistors and performing an AND Boolean operation on the delayed input signal and input PWM signal.

6. The circuit according to claim 5 wherein the low level signal generator is further configured to generate from the low side signal a low side low level on signal having a on trigger pulse of a given length starting in correspondence of a falling edge of the low side signal and a low side low level off signal having an off trigger pulse of given length starting with a rising edge of the low side signal and a high side low level on signal and a high side low level off signal having trigger pulses and starting in correspondence of the rising edge and of the falling edge of the high side signal.

7. The circuit according to claim 6 further comprising an additional synchronicity loop that generates a synchronism PWM delayed signal which is synchronized and delayed with respect to the PWM signal, said additional synchronicity loop having inputs receiving from taps of the high side and low side drive chains a low side delayed signal and a high side delayed signal, said additional synchronicity loop being configured to generate from said low side delayed and high side delayed signals set and reset signals of a second set-reset latch which outputs the synchronism PWM delayed signal.

8. An electronic system, comprising:
   an output driver including a high side transistor and a low side transistor;
   a control driver circuit coupled to the output driver, the control driver including a high side control driver and a low side control driver, each of the high side control driver and low side control driver including:
   a set-reset latch having set and reset inputs and having an output configured to generates a high voltage level control drive signal that is supplied to generate a control signal on a control node of the corresponding high side or low side transistor in the output driver; and
   a differential capacitive level shifter circuit configured to receive first and second low voltage level input signals and configured to generate high voltage level set and reset signals that are applied to drive the set and reset inputs of the set-reset latch based on the low voltage level input signals.

9. The electronic system of claim 8, wherein the differential capacitive level shifter circuit comprises:
   a differential circuit having first and second outputs coupled to the set and reset inputs of the corresponding set-reset latch and having first and second inputs, the differential circuit configured to generate the high voltage level set and reset signals responsive to first and second high voltage input signals received on the first and second inputs; and
- a first high voltage capacitive circuit having a first node coupled to the first input and a second node coupled to receive the first low voltage level input signal; and
- a second high voltage capacitive circuit having a first node coupled to the second input and a second node coupled to receive the second low voltage level input signal.

10. The electronic system of claim 9 further comprising a signal generator configured to receive a pulse width modulated input signal and configured to generate, based on the pulse width modulated input signal, the first and second low voltage level input signals for the high side control driver and the low side control driver, the first and second low voltage level input signals being complementary digital signals that are applied to the second nodes of the first and second high voltage capacitive circuits to generate the first and second high voltage input signals supplied to the corresponding differential circuit.

11. The electronic system of claim 10 wherein each differential capacitive level shifter circuit includes two hysteresis circuits, each hysteresis circuit configured to provide a current to the first and second outputs of the differential circuit responsive to complementary feedback signals that are generated based on the high voltage level control drive signal that is supplied to the control node of the corresponding high side or low side transistor in the output driver.

12. The electronic system of claim 11 further comprising a drive chain including a plurality of series-connected buffers coupled between the output of each set-reset latch and the control node of the corresponding high side or low side transistor in the output driver, and wherein a tap is defined between adjacent series-connected buffers and first and second selected taps provide the complementary feedback signals to corresponding hysteresis circuits.

13. The electronic system of claim 8 wherein the output driver comprises one of a half bridge output driver and a full bridge output driver.

14. The electronic system of claim 13 wherein the half bridge output driver or full bridge output drive comprises MOSFET transistors.

15. The electronic system of claim 8 further comprising one of envelope tracking circuitry and electromedical circuitry coupled to the output driver.

16. The electronic system of claim 15, wherein the envelope tracking circuitry comprises one of digital communication base-station circuitry, mobile phone circuitry, and digital television circuitry, and wherein the electromedical circuitry comprise ecographic circuitry.

17. A circuit, comprising:
- a high side gate driver including a high side latch circuit configured to generate a high voltage gate drive signal in response to high voltage set and reset signals, the high voltage gate drive signal configured to be applied to as a gate drive signal to at least one high side transistor of a bridge circuit and the high side gate driver further including a differential capacitive level shifter circuit configured to receive a high side input signal having a low voltage and to generate the high voltage set and reset signal in response to the high side input signal; and
- a low side gate driver including a low side latch circuit configured to generate a high voltage gate drive signal in response to high voltage set and reset signals, the high voltage gate drive signal configured to be applied to as a gate drive signal to at least one low side transistor of the bridge circuit and the low side gate driver further including a differential capacitive level shifter circuit configured to receive a low side input signal having a low voltage and to generate the high voltage set and reset signal in response to the low side input signal.

18. The circuit of claim 17, wherein each differential capacitive level shifter circuit includes two hysteresis circuits configured to supply additional currents to generate the high voltage set and reset signal two outputs of the differential capacitive level shifter circuit responsive to a first feedback signal having a voltage corresponding to the logic state of the gate drive signal applied to the at least one high side transistor and a second feedback signal having a voltage corresponding to the complement of the logic state of the gate drive signal applied to the are least one high side transistor.

19. The circuit of claim 18, wherein each of the gate drivers further comprises a plurality of series-connected inverting buffers coupled to receive the high voltage gate drive signal, the series-connected inverting buffers having a plurality of taps and each of the first and second feedback signals being generated on a respective one of the plurality of taps.

20. The circuit of claim 17, wherein the each of the high side and low side input signals is a pulse width modulated signal.

21. The circuit of claim 17, wherein each of the high side and low side latch circuits comprises a set-reset latch.

* * * * *